(12) United States Patent
Lin

(10) Patent No.: US 11,781,818 B2
(45) Date of Patent: Oct. 10, 2023

(54) HEAT DISSIPATION FIN AND HEAT DISSIPATION MODULE

(71) Applicant: ASROCK INC., Taipei (TW)

(72) Inventor: Yi Kun Lin, Taipei (TW)

(73) Assignee: ASROCK INC., Taipei (TW)

( * ) Notice: Subject to any disclaimer, the term of this patent is extended or adjusted under 35 U.S.C. 154(b) by 8 days.

(21) Appl. No.: 17/473,765

(22) Filed: Sep. 13, 2021

(65) Prior Publication Data

US 2022/0136784 A1 May 5, 2022

(30) Foreign Application Priority Data

Oct. 30, 2020 (TW) ................................ 109137851

(51) Int. Cl.
*F28F 1/32* (2006.01)

(52) U.S. Cl.
CPC .................................... *F28F 1/325* (2013.01)

(58) Field of Classification Search
CPC ....... F28F 1/325; F28F 12/32; H01L 23/3672; H01L 23/427; F28D 15/0275; H05K 7/20409; H05K 7/20136
USPC ................................................ 165/80.1, 80.3
See application file for complete search history.

(56) References Cited

U.S. PATENT DOCUMENTS

| | | | |
|---|---|---|---|
| 5,669,438 A * | 9/1997 | Beales | F28F 1/128 165/152 |
| 5,697,432 A * | 12/1997 | Yun | F28F 1/325 165/151 |
| 5,738,168 A * | 4/1998 | Patel | F28F 1/325 165/181 |
| 6,311,490 B1 * | 11/2001 | Conrad | F25B 9/14 60/524 |
| 7,021,370 B2 * | 4/2006 | Papapanu | F28F 1/325 62/515 |
| 7,578,339 B2 * | 8/2009 | Kaga | F28F 1/32 165/151 |
| 8,505,618 B2 * | 8/2013 | Ogawa | F28F 1/325 165/181 |
| 11,402,163 B2 * | 8/2022 | Lin | F28F 13/12 |
| 11,561,014 B2 * | 1/2023 | Kim | F28D 1/047 |
| 2002/0003035 A1 * | 1/2002 | Oh | F28F 1/325 165/181 |

(Continued)

FOREIGN PATENT DOCUMENTS

| | | | | |
|---|---|---|---|---|
| CN | 2772022 | | 4/2006 | |
| EP | 3401420 | A1 * | 11/2018 | ............. B21D 53/08 |

(Continued)

*Primary Examiner* — Claire E Rojohn, III
*Assistant Examiner* — Gustavo A Hincapie Serna
(74) *Attorney, Agent, or Firm* — J.C. PATENTS

(57) ABSTRACT

A heat dissipation fin includes a body and an airflow guiding structure. The body has a first surface and a second surface opposite to each other and an airflow hole penetrating the first surface and the second surface. The airflow guiding structure is obliquely joined on the first surface of the body and covers part of the airflow hole. An airflow passage is formed between the airflow guiding structure and the first surface. Part of an airflow is adapted to pass along the first surface through the airflow passage to flow away. Part of the airflow passes in a direction from the second surface through the airflow hole to flow away.

13 Claims, 5 Drawing Sheets

(56) References Cited

U.S. PATENT DOCUMENTS

| | | | | |
|---|---|---|---|---|
| 2007/0089869 | A1* | 4/2007 | Hwang | F28D 15/0233 361/709 |
| 2007/0119566 | A1* | 5/2007 | Peng | H01L 23/467 257/E23.099 |
| 2008/0023176 | A1* | 1/2008 | Peng | F04D 29/582 165/122 |
| 2008/0135215 | A1* | 6/2008 | Wu | H01L 23/427 257/E23.084 |
| 2010/0025013 | A1* | 2/2010 | Zha | F28D 15/0275 165/80.3 |
| 2010/0147493 | A1* | 6/2010 | Dai | H01L 23/427 165/104.26 |
| 2011/0094258 | A1* | 4/2011 | Lee | F28F 1/12 165/181 |
| 2011/0120685 | A1* | 5/2011 | Van Heeswijk | F28D 5/00 165/170 |
| 2012/0103572 | A1* | 5/2012 | Hwang | F28D 15/0275 165/104.26 |
| 2012/0103573 | A1* | 5/2012 | Hwang | H01L 23/427 165/104.26 |
| 2014/0262170 | A1* | 9/2014 | Buckrell | F28F 1/128 165/151 |
| 2016/0178283 | A1* | 6/2016 | Wang | F28F 1/32 165/109.1 |
| 2019/0154350 | A1* | 5/2019 | Dulberg | B01D 53/265 |
| 2019/0390922 | A1* | 12/2019 | Wang | B21D 53/022 |
| 2021/0372710 | A1* | 12/2021 | Tsai | F28D 15/0275 |

FOREIGN PATENT DOCUMENTS

| | | |
|---|---|---|
| TW | 448288 | 8/2001 |
| TW | M403012 | 5/2011 |

* cited by examiner

HEAT DISSIPATION FIN AND HEAT DISSIPATION MODULE

CROSS-REFERENCE TO RELATED APPLICATION

This application claims the priority benefit of Taiwanese application no. 109137851, filed on Oct. 30, 2020. The entirety of the above-mentioned patent application is hereby incorporated by reference herein and made a part of this specification.

BACKGROUND

Technical Field

The disclosure relates to a heat dissipation fin and a heat dissipation module; particularly, the disclosure relates to a heat dissipation fin and a heat dissipation module with improved heat dissipation efficiency.

Description of Related Art

Heat dissipation by utilizing heat dissipation fins combined with a fan may already be a relatively common means. In the conventional heat dissipation structure, airflow blown by the fan flows through the heat dissipation fins, and heat energy of the heat dissipation fins is taken away. Gaps between the heat dissipation fins form flow passages for airflow, and the flow passages would be of the length of the entire fin. After an airflow passes through heat pipes disposed through the heat dissipation fins, temperature of the airflow is increased quickly. In addition, the high-temperature airflow may still require to pass through the flow passages before being discharged. Therefore, heat energy is likely to be accumulated in the flow passages, affecting heat dissipation efficiency.

SUMMARY

The disclosure provides a heat dissipation fin with improved heat dissipation efficiency.

The disclosure provides a heat dissipation module including the above-mentioned heat dissipation fin.

In the disclosure, a heat dissipation fin includes a body and an airflow guiding structure. The body includes a first surface and a second surface opposite to each other and an airflow hole penetrating the first surface and the second surface. The airflow guiding structure is obliquely joined to the first surface of the body and covers part of the airflow hole. An airflow passage is formed between the airflow guiding structure and the first surface. Part of an airflow is adapted to pass along the first surface through the airflow passage, and part of the airflow passes through the airflow hole from the second surface.

In an embodiment of the disclosure, an extension direction of the airflow passage is perpendicular to an axial direction of the airflow hole.

In an embodiment of the disclosure, two ends of the airflow guiding structure are respectively joined to the first surface located at two sides of the airflow hole. The airflow guiding structure further includes at least one first inclined surface inclined relative to the body. The airflow guiding structure includes a first opening and a second opening opposite to each other. The airflow passage is in communication with the first opening and the second opening. The second opening is greater than the first opening. Part of the airflow is adapted to pass along the first surface via the first opening through the airflow passage and flow away from the second opening.

In an embodiment of the disclosure, the airflow guiding structure includes at least one second inclined surface inclined relative to the body. The at least one second inclined surface is located between the body and the at least one first inclined surface. An inclination angle of the at least one second inclined surface relative to the body is different from an inclination angle of the at least one first inclined surface relative to the body.

In an embodiment of the disclosure, the inclination angle of the at least one second inclined surface relative to the body is greater than the inclination angle of the at least one first inclined surface relative to the body.

In an embodiment of the disclosure, the at least one first inclined surface includes two first inclined surfaces, and the at least one second inclined surface includes two second inclined surfaces. The two first inclined surfaces are adjacent to each other, and a ridge line is formed at a junction between the two first inclined surfaces. The two second inclined surfaces are respectively located between the body and the two first inclined surfaces and are respectively joined to the first surface located at the two sides of the airflow hole.

In an embodiment of the disclosure, the body includes a plurality of heat pipe through holes. The heat pipe through holes are vertically alternately disposed into two rows. The airflow hole and the airflow guiding structure are located below at least one of the heat pipe through holes in an upper row.

In an embodiment of the disclosure, a plurality of heat pipes are adapted to be disposed in the heat pipe through holes and arranged into a first row located above and a second row located below. Part of the airflow is adapted to flow from beside the heat pipes located in the first row along the at least one second inclined surface to the heat pipes located in the second row.

In the disclosure, a heat dissipation module includes the above-mentioned heat dissipation fins, disposed side by side. The airflow hole of one of the heat dissipation fins corresponds to the airflow hole of another one of the heat dissipation fins. In any adjacent two of the heat dissipation fins, the two heat dissipation fins are distinguished into a first fin and a second fin. The airflow guiding structure of the second fin is located between the second surface of the first fin and the first surface of the second fin. Part of an airflow located between the first fin and the second fin is adapted to pass along the first surface of the second fin through the airflow passage of the airflow guiding structure of the second fin. Part of the airflow passes through the airflow hole of the first fin from the second surface of the first fin.

In an embodiment of the disclosure, the airflow guiding structure of the second fin is extended into the airflow hole of the first fin.

Based on the foregoing, in the conventional heat dissipation structure, the high-temperature airflow heated because of passing through the heat pipe may still require to flow through the gaps between the fins before being discharged from the end of the fins, and since the flow passages are longer, heat dissipation efficiency may be affected. Compared with the conventional heat dissipation structure, in the disclosure, the body of the heat dissipation fin has the airflow hole for the airflow to directly leave from the airflow hole, reducing the length of the flow passage and improving heat dissipation efficiency. In addition, since the airflow guiding structure is obliquely joined to the body and covers part of the airflow hole, in the design of the airflow guiding structure combined with the airflow passage and the airflow hole, the airflow may be guided by the airflow guiding structure to flow in the direction away from the fin. By spreading the directions of airflow, heat dissipation efficiency is then improved. Similarly, in the heat dissipation module of the disclosure, part of the airflow located between the first fin and the second fin is adapted to flow away along the airflow passage of the airflow guiding structure. In addition, part of the airflow pass through the airflow hole of the first fin from the second surface of the first fin, and flow outward in the direction away from the first surface of the first fin. As such, the airflow may be directly discharged in the lateral direction to increase heat dissipation efficiency.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
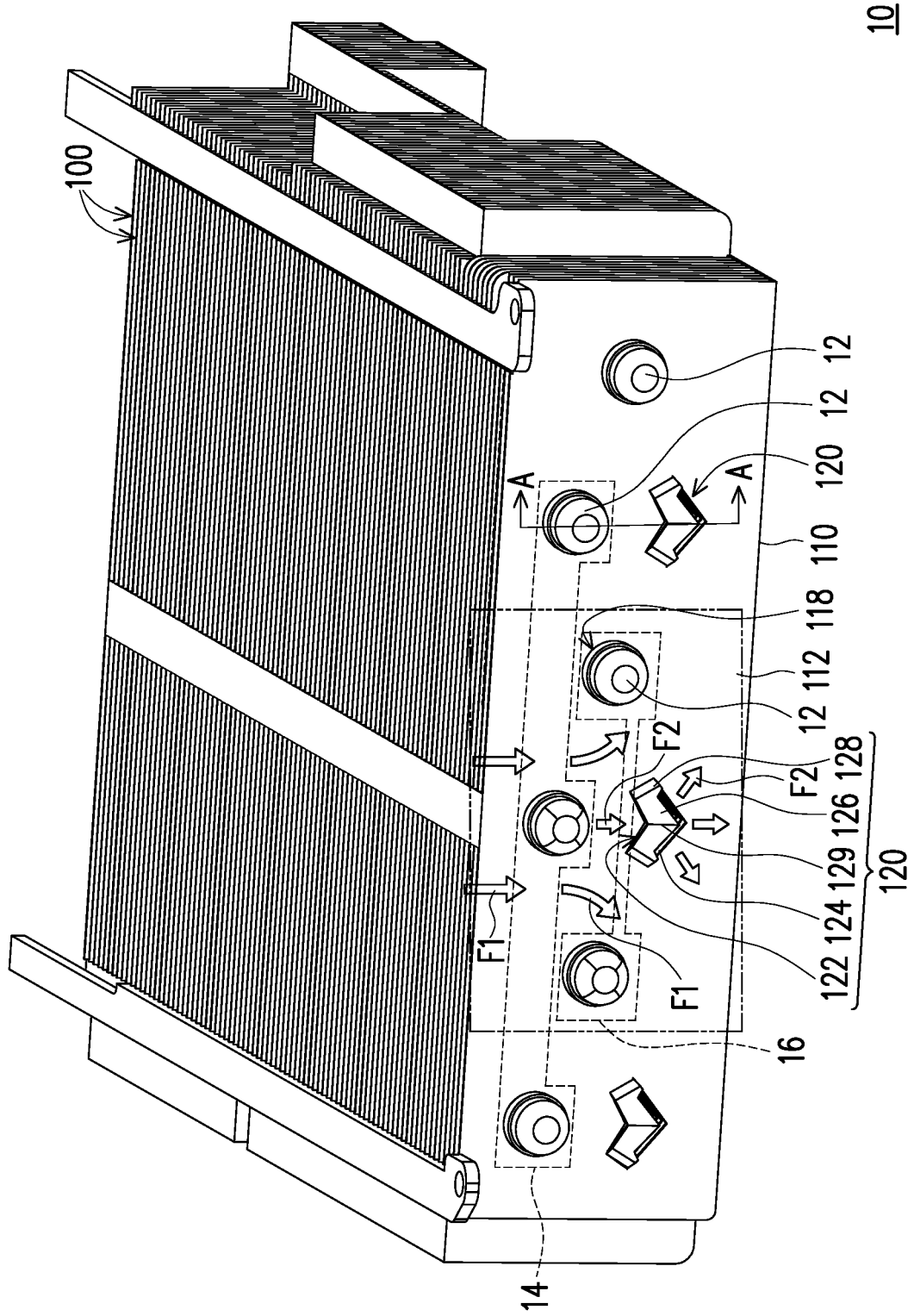
FIG. 1 is a schematic view of a heat dissipation module according to an embodiment of the disclosure.
Figure 2:
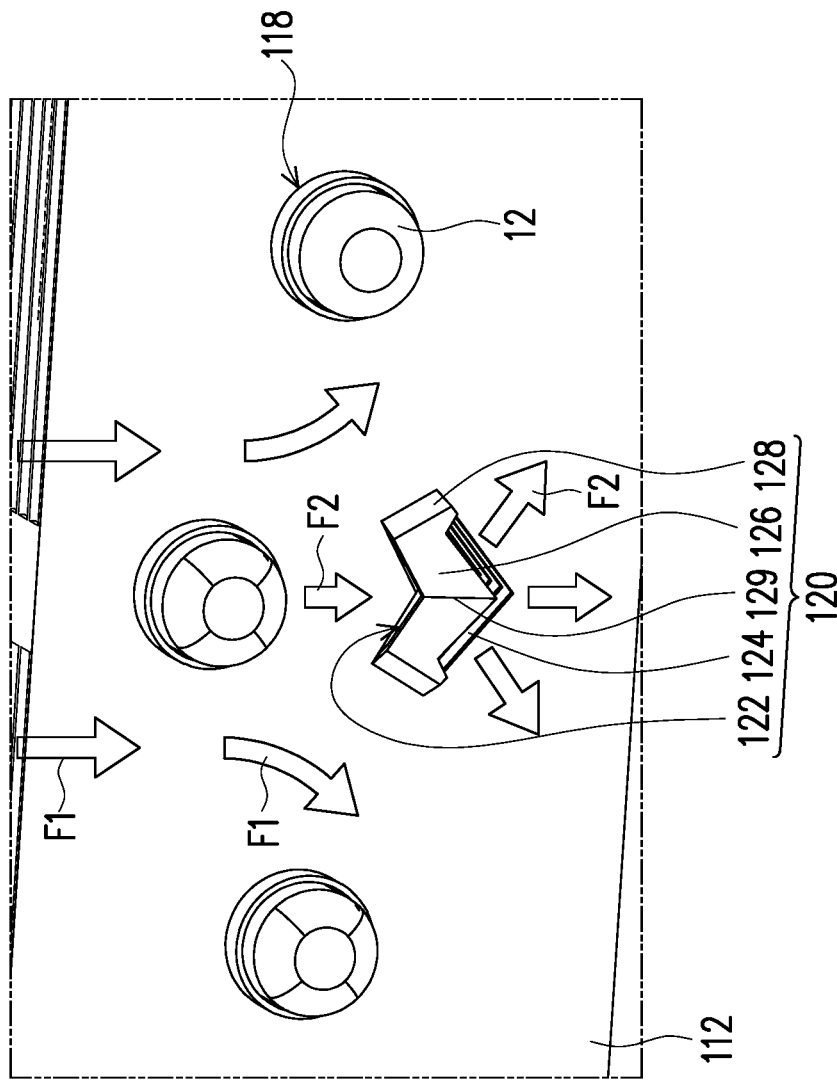
FIG. 2 is a partial enlarged view of FIG. 1.
Figure 3:
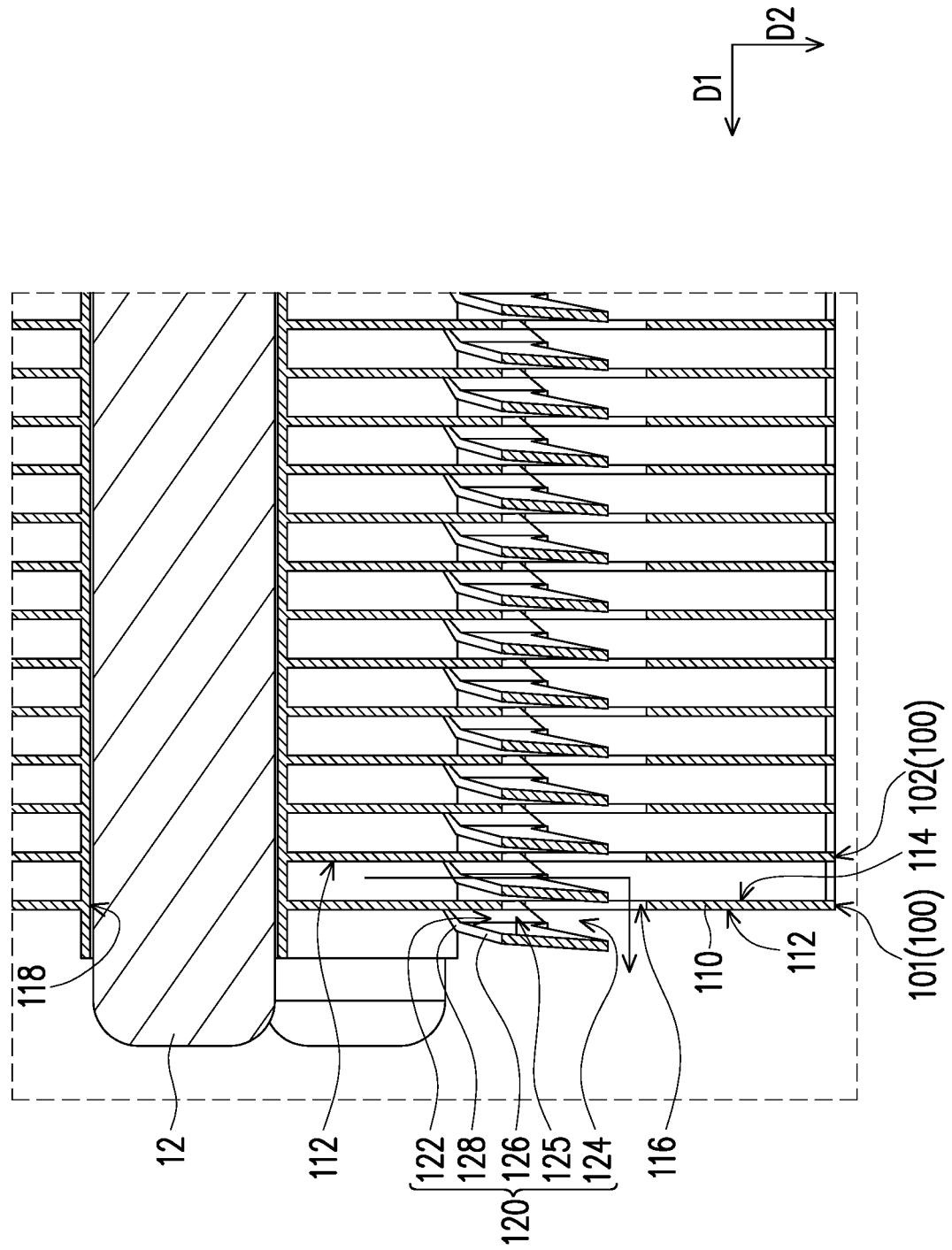
FIG. 3 is a schematic partial cross-sectional view along line A-A of FIG. 1.
Figure 4:
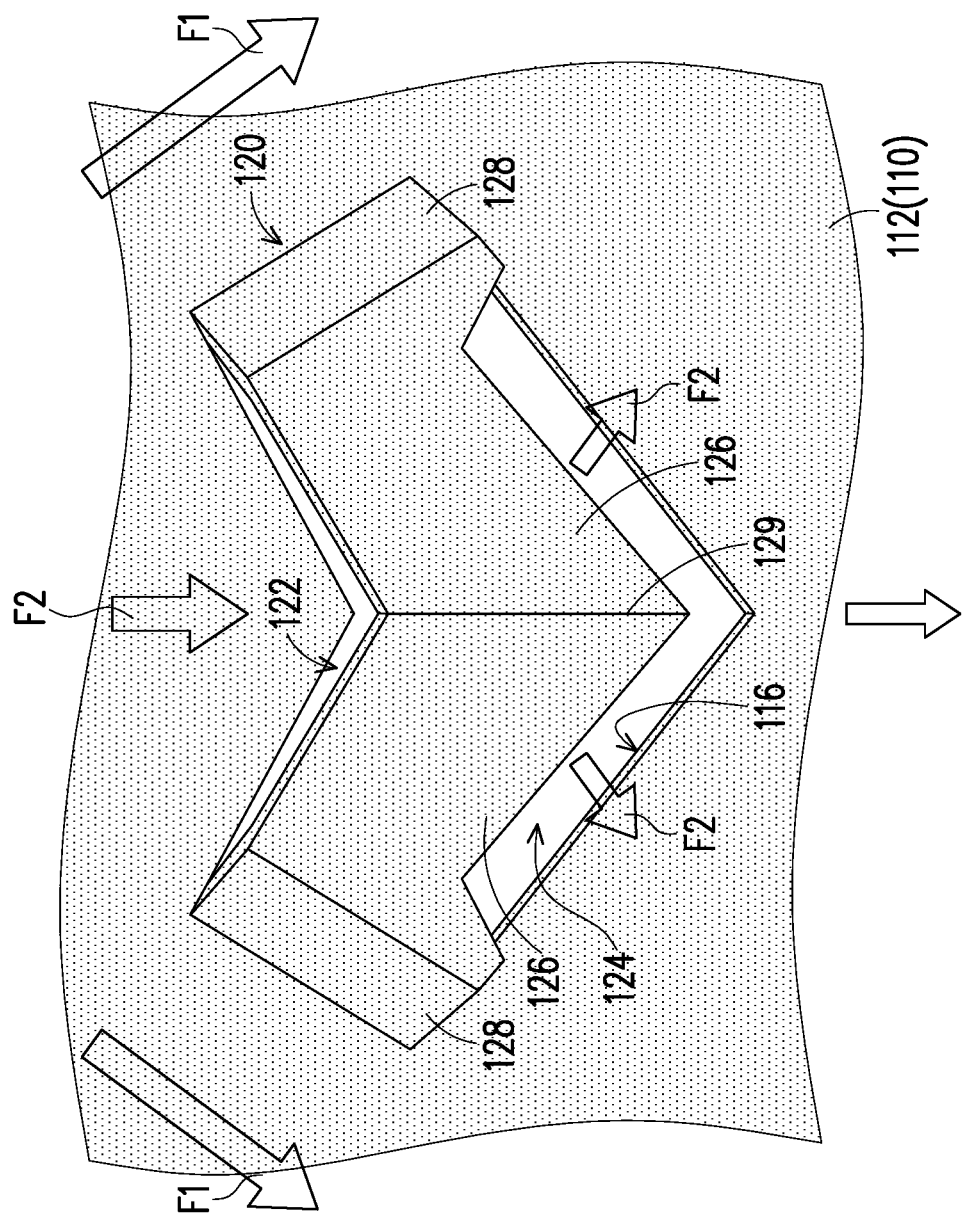
FIG. 4 is a schematic partial view of a heat dissipation fin of the heat dissipation module of FIG. 1.

FIG. 1 is a schematic view of a heat dissipation module according to an embodiment of the disclosure. FIG. 2 is a partial enlarged view of FIG. 1. FIG. 3 is a schematic partial cross-sectional view along line A-A of FIG. 1. FIG. 4 is a schematic partial view of a heat dissipation fin of the heat dissipation module of FIG. 1.

With reference to FIG. 1 to FIG. 4, in this embodiment, a heat dissipation module 10 includes a plurality of heat dissipation fins 100 and a plurality of heat pipes 12. The heat dissipation fins 100 are disposed side by side, and the heat pipes 12 are disposed through the heat dissipation fins 100. In this embodiment, the heat dissipation fins 100 are specially designed and achieve fast heat discharge, which will be described in the following.

In this embodiment, the heat dissipation fin 100 includes a body 110 and an airflow guiding structure 120. As shown in FIG. 3, the body 110 has a first surface 112 and a second surface 114 opposite to each other and an airflow hole 116 penetrating the first surface 112 and the second surface 114.

As shown in FIG. 4, the airflow guiding structure 120 is obliquely joined to the first surface 112 of the body 110. In this embodiment, the airflow guiding structure 120 is joined to the first surface 112 of the body 110 located at two sides of the airflow hole 116.

The airflow guiding structure 120 covers part of the airflow hole 116. In this embodiment, the airflow guiding structure 120 covers, for example, more than half of the area of the airflow hole 116. For example, the airflow guiding structure 120 covers 40% to 80% of the airflow hole 116. After testing, such a design shows good performance.

In addition, as shown in FIG. 3, an airflow passage 125 is formed between the airflow guiding structure 120 and the first surface 112. The airflow guiding structure 120 has a first opening 122 and a second opening 124 opposite to each other. The airflow passage 125 is in communication with the first opening 122 and the second opening 124. The first opening 122 is, for example, an upper opening closer to the position where an airflow enters. The second opening 124 is, for example, a lower opening closer to the position where the airflow leaves. Nonetheless, the relative positions of the first opening 122 and the second opening 124 are not limited thereto. In addition, an axial direction D1 of the airflow hole 116 is perpendicular to an extension direction D2 of the airflow passage 125.

Moreover, as shown in FIG. 3, the airflow guiding structure 120 also includes at least one first inclined surface 126 inclined relative to the body 110. In this embodiment, the first inclined surface 126 is inclined downward, such that the second opening 124 is greater than the first opening 122. The first inclined surface 126 may be configured to guide the flow direction of part of the airflow, such that part of the airflow may flow downward along the first inclined surface 126 and in a direction away from the first surface 112.

As shown in FIG. 4, in this embodiment, the airflow guiding structure 120 also has at least one second inclined surface 128 inclined relative to the body 110. The at least one second inclined surface 128 is located between the body 110 and the at least one first inclined surface 126. The inclination angle of the at least one second inclined surface 128 relative to the body 110 is different from the inclination angle of the at least one first inclined surface 126 relative to the body 110. Specifically, in this embodiment, the inclination angle of the second inclined surface 128 relative to the body 110 is greater than the inclination angle of the first inclined surface 126 relative to the body 110. In this embodiment, the second inclined surface 128 has a relatively great slope and makes the airflow guiding structure 120 further protrude from the first surface 112 of the body 110, such that there may exist a relatively great space between the airflow guiding structure 120 and the body 110 for an airflow to pass through.

In this embodiment, the airflow guiding structure 120 is exhibited in a V-shape. The at least one first inclined surface 126 includes two first inclined surfaces 126, and the at least one second inclined surface 128 includes two second inclined surfaces 128. The two first inclined surfaces 126 are adjacent to each other, and a ridge line 129 is formed at the junction between the two first inclined surfaces 126. The two second inclined surfaces 128 are respectively located between the body 110 and the two first inclined surfaces 126 and are respectively joined to the first surface 112 located at two sides of the airflow hole 116. Naturally, the form and shape of the airflow guiding structure 120 are not limited thereto.

Notably, in this embodiment, the first inclined surface 126 and the second inclined surface 128 are each an inclined surface. Nonetheless, in other embodiments, the inclined surface of the airflow guiding structure 120 may as well be a cambered surface, which is not limited by the drawings.

In this embodiment, the airflow guiding structure 120 and the body 110 are integral. Manufacturers may manufacture the airflow guiding structure 120 and the airflow hole 116 at the same time by stamping. In other embodiments, the airflow guiding structure 120 and the body 110 may as well be two elements manufactured separately and then assembled together.

With reference back to FIG. 1, the body 110 of each heat dissipation fin 100 includes a plurality of heat pipe through holes 118. The heat pipes 12 are disposed through the heat pipe through holes 118. The heat pipe through holes 118 are vertically alternately disposed into two rows, namely a first row 14 located relatively above and a second row 16 located relatively below. In this embodiment, the airflow hole 116 and the airflow guiding structure 120 are located below the heat pipe through holes 118 in the first row 14.

In addition, from FIG. 2 combined with FIG. 4, two outer contours of the two second inclined surfaces 128 are respectively inclined to the left and to the right. Part of an airflow F1 may be guided to move from beside the heat pipes 12 in the first row 14 along the outer contours of the two second inclined surfaces 128 to the lower left and to the lower right, and flow toward the heat pipes 12 in the second row 16 to lower the temperature of the heat pipes 12 in the second row 16.

The heat dissipation module 10 of the embodiment may be disposed on a heat source (e.g., a central processing unit or a display chip, not shown), and the heat pipes 12 are thermally coupled to the heat source. Therefore, heat energy emitted by the heat source are conducted to the heat pipes 12 and then conducted to the heat dissipation fin 100. A fan may be disposed above the heat dissipation fin 100. An airflow blown by the fan flows between the heat dissipation fins 100 and takes away the heat energy of the heat dissipation fins 100.

Accordingly, in the heat dissipation module 10, the heat pipes 12 have the highest temperature. In the heat dissipation fins 100, the portion close to the heat pipe 12 has the higher temperature. When the airflow is blown from the top to the bottom, the relatively low temperature of the airflow is increased quickly after the airflow passes through the heat pipe 12. In the conventional structure, the high-temperature airflow may require to pass through gaps between the fins before being discharged from the tips (e.g., the lower ends) of the fins. Since the flow passages are relatively long, heat dissipation efficiency may be affected.

From FIG. 2 combined with FIG. 4, it can be observed that, in this embodiment, part of an airflow F2 passes through the heat pipe 12 in the first row along the first surface 112 via the first opening 122 through the airflow passage 125, and flows away from the second opening 124. In addition, part of the airflow passes through the airflow hole 116 from the second surface 114 to flow away from the first surface 112. Accordingly, the high-temperature airflow first flows outward from the airflow passage 125 and the airflow hole 116 in the lateral direction, and does not require to flow through the entire heat dissipation fin 100 before being discharged from the lower end of the heat dissipation fin 100, which effectively improves heat dissipation.

With reference to FIG. 3, in the heat dissipation module 10 of this embodiment, the airflow holes 116 of the heat dissipation fins 100 are in communication and correspondence with each other. In any adjacent two of heat dissipation fins 100 (the leftmost two heat dissipation fins 100 are taken as an example in FIG. 3, but any two adjacent heat dissipation fins 100 may be distinguished as such), the two heat dissipation fins 100 may be distinguished into a first fin 101 and a second fin 102. The airflow guiding structure 120 of the second fin 102 protrudes toward the first fin 101 and is located between the second surface 114 of the first fin 101 and the first surface 112 of the second fin 102.

The airflow flowing between the first fin 101 and the second fin 102 (the airflow located beside the first surface 112 of the second fin 102) flows along the gap between the first surface 112 of the second fin 102 and the second surface 114 of the first fin 101. Since the airflow guiding structure 120 of the second fin 102 is located between the first fin 101 and the second fin 102, part of the airflow flows along the first surface 112 of the second fin 102 into the first opening 122 of the airflow guiding structure 120 of the second fin 102, and passes through the airflow passage 125 to flow outward from the second opening 124. Since the airflow guiding structure 120 is obliquely disposed slightly outward relative to the body 110, during the process of flowing along the inside of the airflow guiding structure 120, the airflow in the airflow guiding structure 120 gradually changes its direction and flows in the direction away from the first surface 112 of the second fin 102, namely in the direction toward the second surface 114 of the first fin 101. After that, the airflow flows outward of the second opening 124 and passes through the airflow hole 116 of the first fin 101, and flows outward in the direction away from the first surface 112.

For the first fin 101, the airflow located beside the second surface 114 of the first fin 101 may pass along the first inclined surface 126 and second inclined surface 128 of the airflow guiding structure 120 of the second fin 102 through the airflow hole 116 of the first fin 101 and flow out of the first surface 112 of the first fin 101.

Notably, in any adjacent two of the heat dissipation fins 100, the airflow guiding structure 120 of one of the heat dissipation fins 100 is extended into the airflow hole 116 of the other of the heat dissipation fins 100. Specifically, in this embodiment, the airflow guiding structure 120 of the second fin 102 is extended into the airflow hole 116 of the first fin 101. Such a design may increase the probability of the airflow passing through the airflow hole 116 of the first fin 101 and flowing outward from the first surface 112 of the first fin 101. Naturally, in other embodiments, it is also possible that the airflow guiding structure 120 of the second fin 102 is not extended into the airflow hole 116 of the first fin 101. The disclosure is not limited thereto.

Figure 5:
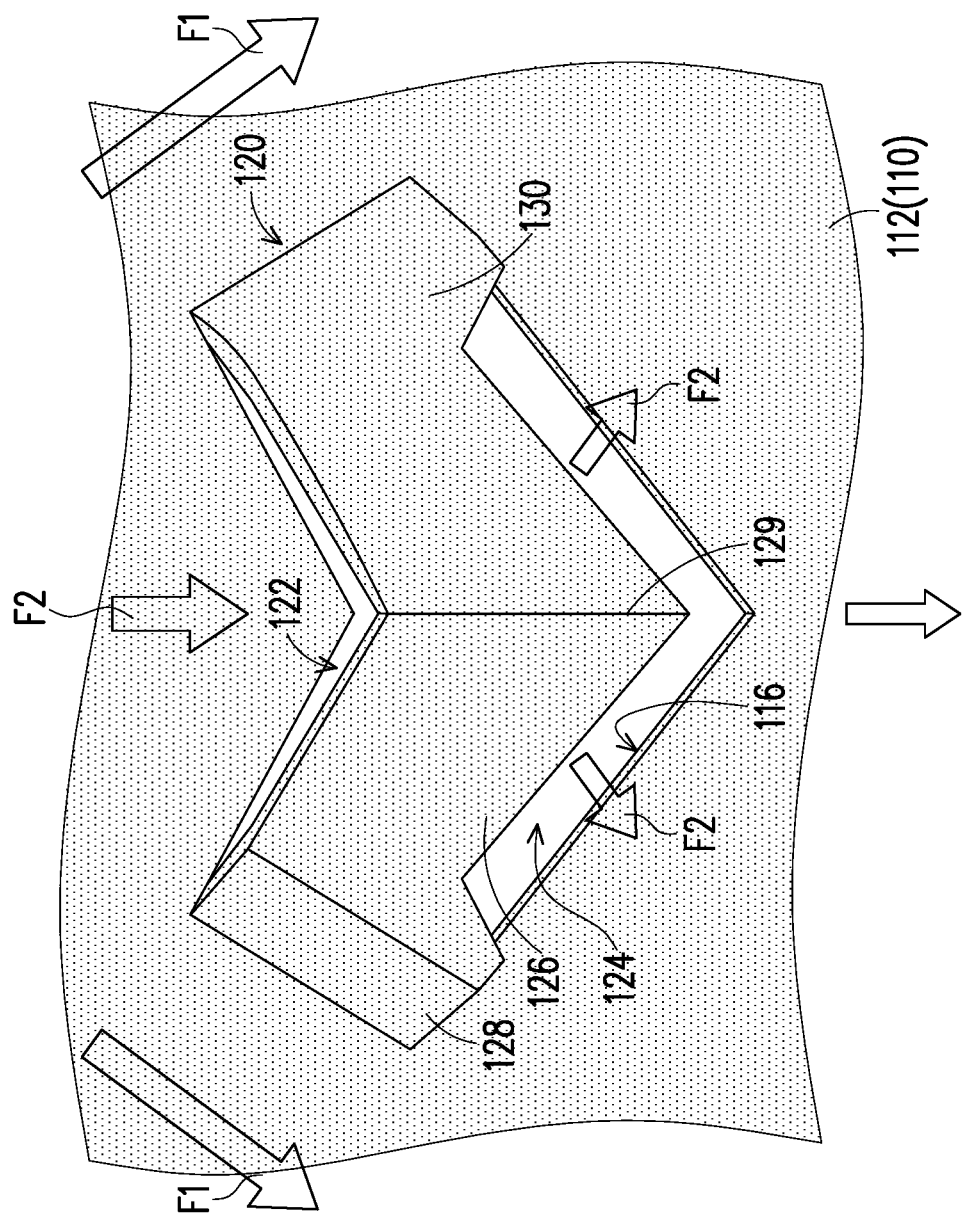
FIG. 5 is a schematic view of a heat dissipation fin according to another embodiment of the disclosure.

FIG. 5 is a schematic view of a heat dissipation fin according to another embodiment of the disclosure. With reference to FIG. 5, in this embodiment, the airflow guiding structure 120 may also be presented in an asymmetric structure. For example, the airflow guiding structure 120 may include a first inclined surface 126, a single second inclined surface 128, and a cambered surface part 130. The number of the first inclined surface 126 and the number of the second inclined surface 128 are not limited.

In summary of the foregoing, in the conventional heat dissipation structure, the high-temperature airflow heated by the heat pipe may still require to flow through the gaps between the fins before being discharged from the end of the fins, and since the flow passages are longer, heat dissipation efficiency may be affected. Compared with the conventional heat dissipation structure, in the disclosure, the body of the heat dissipation fin has the airflow hole for the airflow to directly leave from the airflow hole, reducing the length of the flow passage and improving heat dissipation efficiency. In addition, since the airflow guiding structure is obliquely joined to the body and covers part of the airflow hole, in the design of the airflow guiding structure combined with the airflow passage and the airflow hole, the airflow may be guided by the airflow guiding structure to flow in the direction (lateral direction) away from the first surface to increase the ratio of airflow flowing out in the lateral direction and then improve heat dissipation efficiency. Similarly, in the heat dissipation module of the disclosure, part of the airflow located between the first fin and the second fin is adapted to flow along the airflow guiding structure of the second fin, pass through the airflow hole of the first fin, and flow outward from the first surface of the first fin. As such, the airflow may be directly discharged in the lateral direction to increase heat dissipation efficiency.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A heat dissipation fin, comprising:
a body comprising a first surface and a second surface opposite to each other and an airflow hole penetrating the first surface and the second surface; and
an airflow guiding structure obliquely joined to the first surface of the body and covering part of the airflow hole, wherein an airflow passage is formed between the airflow guiding structure and the first surface, part of an airflow is adapted to pass along the first surface through the airflow passage, and part of the airflow passes through the airflow hole from the second surface,
wherein the airflow guiding structure further comprises at least one first inclined surface inclined relative to the body and at least one second inclined surface inclined relative to the body, the at least one second inclined surface is located between the body and the at least one first inclined surface, and an inclination angle of the at least one second inclined surface relative to the body is different from an inclination angle of the at least one first inclined surface relative to the body,
wherein the at least one first inclined surface comprises two first inclined surfaces, the at least one second inclined surface comprises two second inclined surfaces, the two first inclined surfaces are adjacent to each other, a ridge line is formed at a junction between the two first inclined surfaces, and the two second inclined surfaces are respectively located between the body and the two first inclined surfaces and are respectively joined to the first surface located at the two sides of the airflow hole.

2. The heat dissipation fin according to claim 1, wherein an extension direction of the airflow passage is perpendicular to an axial direction of the airflow hole.

3. The heat dissipation fin according to claim 1, wherein two ends of the airflow guiding structure are respectively joined to the first surface located at two sides of the airflow hole, the airflow guiding structure comprises a first opening and a second opening opposite to each other, the airflow passage is in communication with the first opening and the second opening, the second opening is greater than the first opening, and part of the airflow is adapted to pass along the first surface via the first opening through the airflow passage and flow away from the second opening.

4. The heat dissipation fin according to claim 1, wherein the inclination angle of the at least one second inclined surface relative to the body is greater than the inclination angle of the at least one first inclined surface relative to the body.

5. The heat dissipation fin according to claim 1, wherein the body comprises a plurality of heat pipe through holes, the heat pipe through holes are vertically alternately disposed into two rows, and the airflow hole and the airflow guiding structure are located below at least one of the heat pipe through holes in an upper row.

6. The heat dissipation fin according to claim 5, wherein a plurality of heat pipes are adapted to be disposed in the heat pipe through holes and arranged into a first row located above and a second row located below, and part of the airflow is adapted to flow from beside the heat pipes located in the first row along the at least one second inclined surface to the heat pipes located in the second row.

7. A heat dissipation module, comprising:
a plurality of heat dissipation fins disposed side by side, each of the heat dissipation fins comprising:
a body comprising a first surface and a second surface opposite to each other and an airflow hole penetrating the first surface and the second surface; and
an airflow guiding structure obliquely joined to the first surface of the body and covering part of the airflow hole, wherein an airflow passage is formed between the airflow guiding structure and the first surface,
wherein the airflow hole of one of the heat dissipation fins corresponds to the airflow hole of another one of the heat dissipation fins, and
wherein in any adjacent two of the heat dissipation fins, the two heat dissipation fins are distinguished into a first fin and a second fin, the airflow guiding structure of the second fin is located between the second surface of the first fin and the first surface of the second fin, part of an airflow located between the first fin and the second fin is adapted to pass along the first surface of the second fin through the airflow passage of the airflow guiding structure of the second fin, and part of the airflow passes through the airflow hole of the first fin from the second surface of the first fin,
wherein the airflow guiding structure further comprises at least one first inclined surface inclined relative to the body and at least one second inclined surface inclined relative to the body, the at least one second inclined surface is located between the body and the at least one first inclined surface, and an inclination angle of the at least one second inclined surface relative to the body is different from an inclination angle of the at least one first inclined surface relative to the body,
wherein the at least one first inclined surface comprises two first inclined surfaces, the at least one second inclined surface comprises two second inclined surfaces, the two first inclined surfaces are adjacent to each other, a ridge line is formed at a junction between the two first inclined surfaces, and the two second inclined surfaces are respectively located between the body and the two first inclined surfaces and are respectively joined to the first surface located at the two sides of the airflow hole.

8. A heat dissipation module, comprising:
a plurality of heat dissipation fins disposed side by side, each of the heat dissipation fins comprising:
a body comprising a first surface and a second surface opposite to each other and an airflow hole penetrating the first surface and the second surface; and
an airflow guiding structure obliquely joined to the first surface of the body and covering part of the airflow hole, wherein an airflow passage is formed between the airflow guiding structure and the first surface,
wherein the airflow hole of one of the heat dissipation fins corresponds to the airflow hole of another one of the heat dissipation fins, and wherein in any adjacent two of the heat dissipation fins, the two heat dissipation fins are distinguished into a first fin and a second fin, the airflow guiding structure of the second fin is located between the second surface of the first fin and the first surface of the second fin, part of an airflow located between the first fin and the second fin is adapted to pass along the first surface of the second fin through the airflow passage of the airflow guiding structure of the second fin, and part of the airflow passes through the airflow hole of the first fin from the second surface of the first fin, wherein the airflow guiding structure further comprises at least one first inclined surface inclined relative to the body and at least one second inclined surface inclined relative to the body, the at least one second inclined surface is located between the body and the at least one first inclined surface, and an inclination angle of the at least one second inclined surface relative to the body is different from an inclination angle of the at least one first inclined surface relative to the body, wherein the airflow guiding structure of the second fin is extended into the airflow hole of the first fin.

9. The heat dissipation module according to claim 7, wherein an extension direction of the airflow passage is perpendicular to an axial direction of the airflow hole.

10. The heat dissipation module according to claim 7, wherein two ends of the airflow guiding structure are respectively joined to the first surface located at two sides of the airflow hole, the airflow guiding structure comprises a first opening and a second opening opposite to each other, the airflow passage is in communication with the first opening and the second opening, the second opening is greater than the first opening, and part of the airflow is adapted to pass along the first surface via the first opening through the airflow passage and flow away from the second opening.

11. The heat dissipation module according to claim 7, wherein the inclination angle of the at least one second inclined surface relative to the body is greater than the inclination angle of the at least one first inclined surface relative to the body.

12. The heat dissipation module according to claim 7, wherein the body of each of the heat dissipation fins comprises a plurality of heat pipe through holes, the heat pipe through holes are vertically alternately disposed into two rows, and the airflow hole and the airflow guiding structure are located below at least one of the heat pipe through holes in an upper row.

13. The heat dissipation module according to claim 12, further comprising a plurality of heat pipes disposed in the heat pipe through holes and arranged into a first row located above and a second row located below, wherein part of the airflow is adapted to flow from beside the heat pipes located in the first row along the at least one second inclined surface to the heat pipes located in the second row.

* * * * *